US007443163B2

United States Patent
Warntjes et al.

(10) Patent No.: US 7,443,163 B2
(45) Date of Patent: Oct. 28, 2008

(54) MAGNETIC RESONANCE RECEIVE COILS WITH COMPACT INDUCTIVE COMPONENTS

(75) Inventors: Marcel Warntjes, Best (NL); Marinus J. A. M. Van Helvoort, Best (NL); Steven M. Koenig, Willoughby, OH (US); Thomas Chmielewski, Willoughby Hills, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/575,151

(22) PCT Filed: Aug. 19, 2005

(86) PCT No.: PCT/IB2005/052736

§ 371 (c)(1),
(2), (4) Date: Mar. 13, 2007

(87) PCT Pub. No.: WO2006/030332

PCT Pub. Date: Mar. 23, 2006

(65) Prior Publication Data

US 2007/0262777 A1    Nov. 15, 2007

Related U.S. Application Data

(60) Provisional application No. 60/610,467, filed on Sep. 16, 2004.

(51) Int. Cl.
*G01V 3/00* (2006.01)
(52) U.S. Cl. ...................... 324/318; 324/322
(58) Field of Classification Search ................. 324/318, 324/322
See application file for complete search history.

(56) References Cited

U.S. PATENT DOCUMENTS

| 5,276,398 | A |   | 1/1994  | Withers et al. |
|-----------|---|---|---------|----------------|
| 5,302,901 | A |   | 4/1994  | Snelten |
| 5,351,007 | A | * | 9/1994  | Withers et al. ............... 324/322 |
| 5,565,778 | A | * | 10/1996 | Brey et al. ................... 324/318 |
| 5,728,505 | A |   | 3/1998  | Dueber et al. |
| 5,742,165 | A |   | 4/1998  | Snelten et al. |
| 6,538,445 | B2| * | 3/2003  | James et al. ................. 324/322 |
| 6,605,775 | B1|   | 8/2003  | Seeber et al. |
| 7,332,910 | B2| * | 2/2008  | Laubacher et al. ........... 324/318 |
| 2002/0186114 | A1 | | 12/2002 | Basteres et al. |

(Continued)

FOREIGN PATENT DOCUMENTS

EP          1239297  A2    9/2002

(Continued)

OTHER PUBLICATIONS

Van Helvoort, M.J.A.M., et al.; Modified Bazooka Balun for Common Mode Suppression; EMC Europe, Eindhoven, paper M02; Sep. 2004.

*Primary Examiner*—Louis M Arana

(57) ABSTRACT

A low profile radio frequency coil (32, 44, 44₁, 44₂, 44₃) for use in a magnetic resonance imaging system includes a low profile antenna (34, 102, 202, 302) that is configured to resonate at about a magnetic resonance frequency of the magnetic resonance imaging system. A generally planar inductor (110, 112, 210, 240, 310) is electrically connected or coupled with the low profile antenna. The generally planar inductor provides selected frequency filtering of a radio frequency signal received by or transmitted by the low profile antenna.

27 Claims, 7 Drawing Sheets

U.S. PATENT DOCUMENTS

| | | |
|---|---|---|
| 2003/0057948 A1 | 3/2003 | Van Helvoort et al. |
| 2003/0062896 A1 | 4/2003 | Wong et al. |
| 2003/0209354 A1 | 11/2003 | Seeber |
| 2004/0189422 A1 | 9/2004 | De Bhaillis et al. |
| 2004/0207502 A1 | 10/2004 | Takaike |

FOREIGN PATENT DOCUMENTS

| | | |
|---|---|---|
| GB | 2151791 A | 7/1985 |
| WO | 9825163 A1 | 6/1998 |

\* cited by examiner

MAGNETIC RESONANCE RECEIVE COILS WITH COMPACT INDUCTIVE COMPONENTS

CROSS REFERENCE TO RELATED APPLICATIONS

This application claims the benefit of U.S. provisional application Ser. No. 60/610,467 filed Sep. 16, 2004, which is incorporated herein by reference.

The following finds particular application in radio frequency coils for magnetic resonance imaging. However, it also finds application in radio frequency coils generally.

Radio frequency coils are used in magnetic resonance imaging systems to excite and receive magnetic resonance. The radio frequency coil include an antenna configured to resonate at about the magnetic resonance frequency, and coil electronics that perform various functions such as tuning, decoupling the receive antenna during the transmit phase, providing pre-amplification of a received magnetic resonance signal, providing matching of radio frequency signals between the antenna and the coil cable, trapping out common mode signals or providing other selected frequency filtering, and so forth.

To provide close coupling of the radio frequency coil with a human patient or other imaging subject, surface coils are sometimes arranged in close proximity to, or in actual physical contact with, the imaging subject. For certain parallel imaging modes, an array of coils is used for transmit and/or receive. In medical magnetic resonance imaging, there is interest in incorporating arrays of surface coils into a wearable format, such as a vest or other item of clothing, that can be worn by the patient.

For wearable coils apparel and other applications, it is advantageous to have thin or low profile radio frequency coils. In existing radio frequency coils used for magnetic resonance imaging, the coil profile is generally limited by bully inductive components such as traps or baluns, detuning decouplers, matching circuitry, or so forth. Such bulky inductive components also contribute to coil weight, which can adversely impact wearable coils.

The following contemplates improved apparatuses and methods that overcome the aforementioned limitations and others.

According to one aspect, a low profile radio frequency coil is disclosed for use in a magnetic resonance imaging system. A low profile antenna is configured to resonate at about a magnetic resonance frequency of the magnetic resonance imaging system. A generally planar inductor is electrically connected or coupled with the low profile antenna. The generally planar inductor provides selected frequency filtering of a radio frequency signal received or transmitted by the low profile antenna.

According to another aspect, a magnetic resonance imaging system is disclosed. A main magnet generates a main magnetic field in an imaging region. Magnetic field gradient coils superimpose selected magnetic field gradients on the main magnetic field in the imaging region. A low profile radio frequency coil performs at least one of (i) exciting magnetic resonance in an imaging subject disposed in the imaging region, and (ii) receiving magnetic resonance excited in the imaging subject disposed in the imaging region. The low profile radio frequency coil includes a low profile antenna configured to resonate at about a magnetic resonance frequency of the magnetic resonance imaging system, and a generally planar inductor electrically connected or coupled with the low profile antenna. The generally planar inductor provides selected frequency filtering of a radio frequency signal received or transmitted by the low profile antenna.

One advantage resides in providing thin or low profile radio frequency coils for use in magnetic resonance imaging.

Another advantage resides in reducing stray magnetic fields produced by inductive components of a radio frequency coil used in magnetic resonance imaging.

Yet another advantage resides in simplified manufacturing of radio frequency coils for use in magnetic resonance imaging.

Still yet another advantage resides in tighter manufacturing tolerances for inductors of radio frequency coils used in magnetic resonance imaging.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system including a wearable coils garment and a generally planar surface coil.

Figure 1:
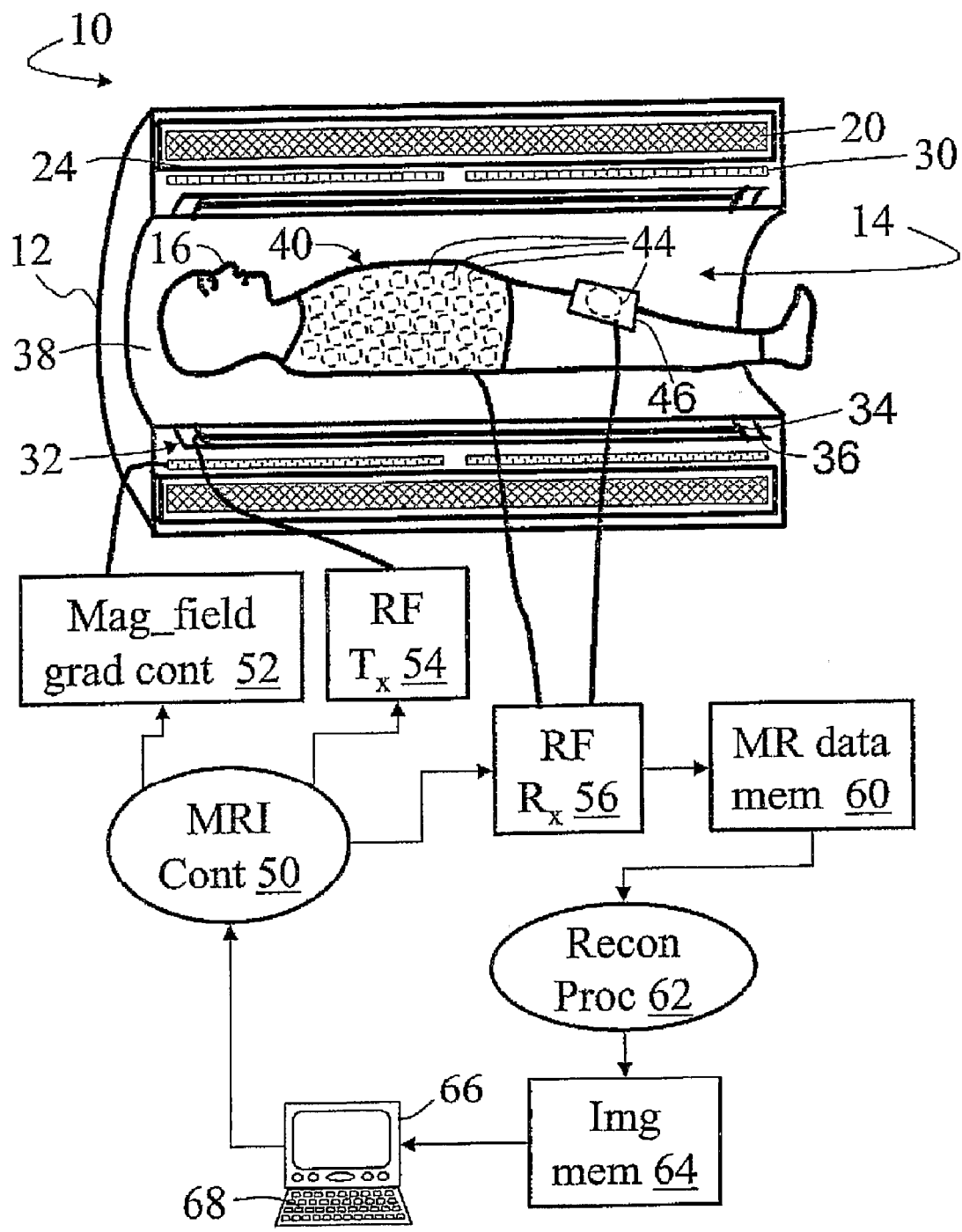
Figure 7A:
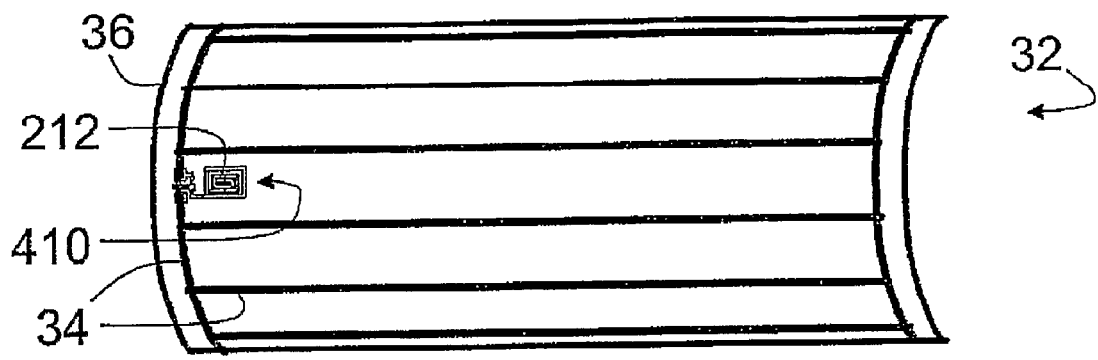
Figure 7B:
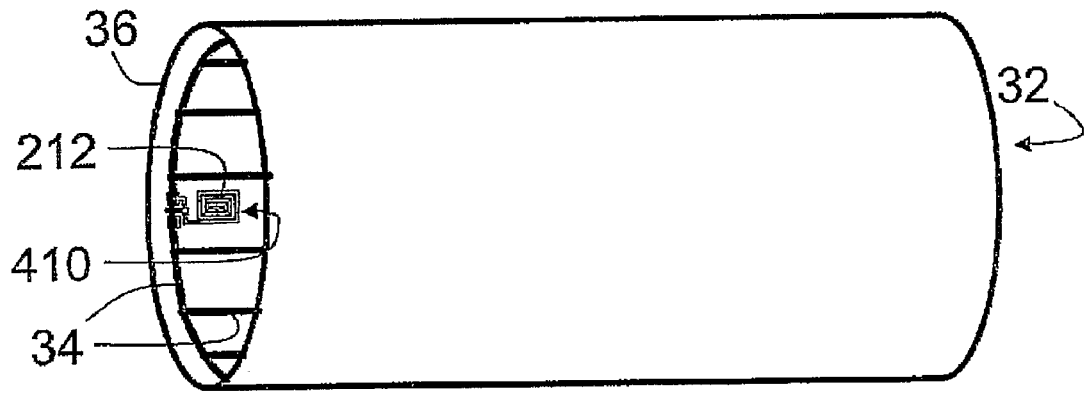
Figure 7C:
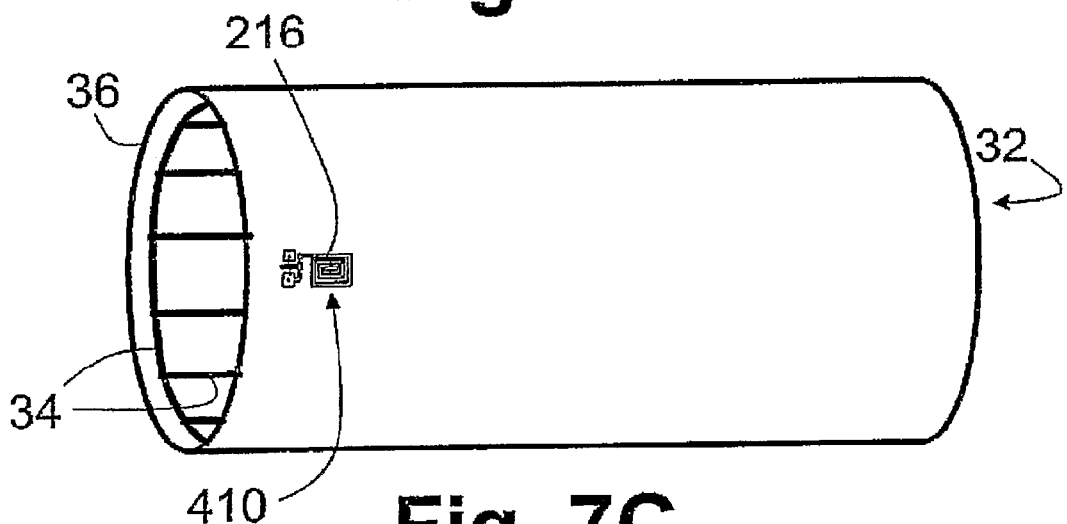

FIGS. 7A, 7B, and 7C show a cutaway perspective view, a first perspective view, and a second perspective view, respectively, of the birdcage coil of the magnetic resonance imaging system of FIG. 1. The vantage point of the perspective view of FIG. 7C is rotated 180° from the vantage point of the perspective views of FIGS. 7A and 7B. In FIG. 7A, a portion of the coil is cut away to fully reveal six rungs and a portion of the second end ring of the birdcage.

With reference to FIG. 1, a magnetic resonance imaging scanner 10 includes a housing 12 defining a generally cylindrical scanner bore 14 inside of which an associated imaging subject 16 is disposed. Main magnetic field coils 20 are disposed inside the housing 12, and produce a main $B_0$ magnetic field directed generally parallel with a central axis of the scanner bore 14. The main magnetic field coils 20 are typically superconducting coils disposed inside cryoshrouding 24, although resistive main magnets can also be used. The housing 12 also houses or supports magnetic field gradient coils 30 for selectively producing magnetic field gradients in the bore 14. The housing 12 further houses or supports a low profile whole body radio frequency body coil 32 for selectively exciting magnetic resonances. In the illustrated embodiment, the coil 32 is a low profile coil formed of conductive traces 34 disposed on a cylindrical substrate 36. The low profile of the coil 32 limits the amount of space within the housing 12 occupied by the coil 32. The housing 12 typically includes a cosmetic inner liner 38 defining the scanner bore 14.

One or more radio frequency surface coils are disposed inside the bore 14 close to or in contact with the imaging subject 16. In some embodiments, a plurality of radio frequency surface coils are attached to or embedded in an item of clothing apparel. In FIG. 1, for example, a stretchable radio frequency coil apparel 40 has coils 44 embedded in a shirt, belt, or wrap. The plurality of surface coils 44 can be used as a phased array of receivers for parallel imaging, as a sensitivity encoding (SENSE) coil array for acquiring SENSE imaging data, or the like. In another approach, the coils are used to acquire imaging data from different areas of the imaging subject 16. In some embodiments, the surface coils can be transmit coils or can be transmit/receive coils. Various combinations of transmit coils, receive coils, and/or transmit/receive coils can be embedded into the coils apparel. Instead of placing coils 44 on or in the item of clothing 40, coils 44 can be disposed as one or more discrete surface coil units 46. Moreover, in some embodiments and in some imaging procedures, the whole body coil 32 is used for receiving magnetic resonance signals.

Regardless of the particular coil or arrangement of coils employed, the main magnetic field coils 20 produce a main $B_0$ magnetic field. A magnetic resonance imaging controller 50 operates magnetic field gradient controllers 52 to selectively energize the magnetic field gradient coils 30, and operates a radio frequency transmitter 54 coupled to the radio frequency coil 32 as shown, or coupled to the coils 44, to selectively inject radio frequency excitation pulses into the subject 16. By selectively operating the magnetic field gradient coils 30 and the radio frequency coil 32 magnetic resonance is generated and spatially encoded in at least a portion of a region of interest of the imaging subject 16.

During imaging data acquisition, the magnetic resonance imaging controller 50 operates a radio frequency receiver 56 coupled to one or more of the coils 44 to acquire magnetic resonance samples that are stored in a magnetic resonance data memory 60. The imaging data are reconstructed by a reconstruction processor 62 into an image representation. A Fourier transform-based reconstruction algorithm, filtered backprojection-based reconstruction, or the like is employed by the reconstruction processor 62 depending upon the format of the acquired magnetic resonance imaging data. For SENSE imaging data, the reconstruction processor 62 reconstructs folded images from the imaging data acquired by each of the radio frequency coils, and then combines the folded images along with coil sensitivity parameters to produce an unfolded reconstructed image.

The reconstructed image generated by the reconstruction processor 62 is stored in an images memory 64, and can be displayed on a user interface 66, stored in non-volatile memory, transmitted over a local intranet or the Internet, viewed, stored, manipulated, or so forth. The user interface 66 also includes one or more operator controls such as a keyboard 68, a scanner control panel, or the like by which a radiologist, technician, or other operator of the magnetic resonance imaging scanner 10 communicates with the magnetic resonance imaging controller 50 to select, modify, and execute magnetic resonance imaging sequences.

The described magnetic resonance imaging system is an example only. The low profile radio frequency coils described herein can be used with substantially any type of magnetic resonance imaging scanner, including but not limited to horizontal bore scanners, vertical bore scanners, open scanners, and so forth.

The coils 44, whether disposed in the coils apparel 40 or as discrete surface coil units 46, are advantageously substantially planar, low profile coils. Similarly, the whole body coil 32 is preferably a low profile coil of small annular thickness. Several example embodiments of these low profile radio frequency coils are next described.

Figure 2:
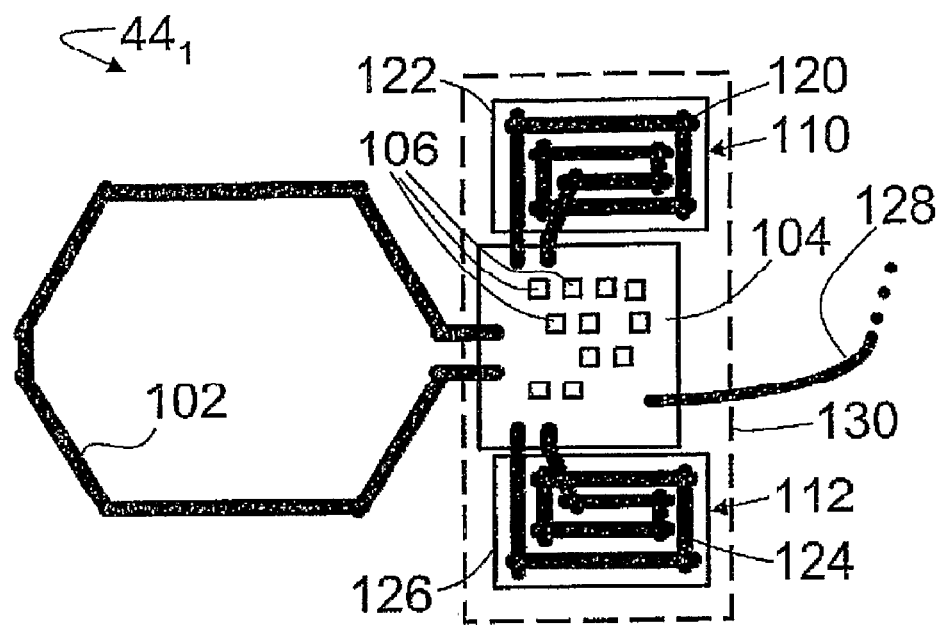
FIG. 2 shows a diagrammatic top view of a generally planar radio frequency coil with electronics including two printed circuit inductors.

With reference to FIG. 2, a generally planar radio frequency coil $44_1$ suitably used as one of the surface coils 44 includes a generally planar radio frequency antenna 102, which in the embodiment of FIG. 2 is a planar conductor loop. While generally planar, the antenna 102 may be arced or contoured to match a selected body portion. The antenna 102 is connected with a generally planar electronics board 104 supporting coil electronics 106 including receive electronics that receive a magnetic resonance signal from the antenna 102. For a transmit coil, or a transmit/receive coil, the coil electronics include transmit electronics that transmit a radio frequency excitation signal via the antenna.

The coil driving electronics further include one or more generally planar inductors, specifically two generally planar printed circuit inductors 110, 112 in the embodiment illustrated in FIG. 2. The inductor 110 is defined by printed circuitry 120 arranged in the shape of a spiral and disposed on an inductor substrate 122, such as a printed circuit board. The inductor 112 is similarly defined by printed circuitry 124 arranged in the shape of a spiral and disposed on a second inductor substrate 126, such as a printed circuit board. The generally planar inductors 110, 112 are incorporated into the electronics 106, and may be used to implement substantially any circuit function that incorporates an inductance, optionally in conjunction with other circuit components such as capacitors. For example, one or both inductors 110, 112 may provide functions such radio frequency trapping to reject a common mode of the radio frequency signal received by or transmitted by the generally planar antenna, selective decoupling of the generally planar antenna during the radio frequency transmit phase, or impedance matching of the electronics 106 with a radio frequency cable 128 that communicates the detected magnetic resonance signal to the receiver 56.

With the inductive conductive circuitry 120, 124 and the coil electronics 106 disposed on separate substrates 104, 122, 126, there is the option of enabling hinged or otherwise flexible junctions between the substrates 104, 122, 126. For example, the connection of the inductive conductive circuitry 120, 124 with the coil electronics 106 can be via flexible conductive wires, in which case the separate substrates 104, 122, 126 can be tilted or otherwise moved relative to one another. Such flexibility can be advantageous, for example, when the generally planar coil $44_1$ serves as one of the coils of the flexible wearable coils apparel 40. In some other embodiments, the inductive conductive circuitry 120, 124 and the coil electronics 106 are disposed on a common substrate 130 (indicated by dashed lines in FIG. 2). The common substrate 130 is optionally a flexible substrate, which can be advantageous for example if the coil $44_1$ including the common substrate 130 is incorporated into the flexible wearable coils apparel 40.

The inductive conductive circuitry 120, 124 produce some stray magnetic fields. However, measurements of these stray fields show that they are typically small, and are negligible for many magnetic resonance imaging applications.

Figure 3A:
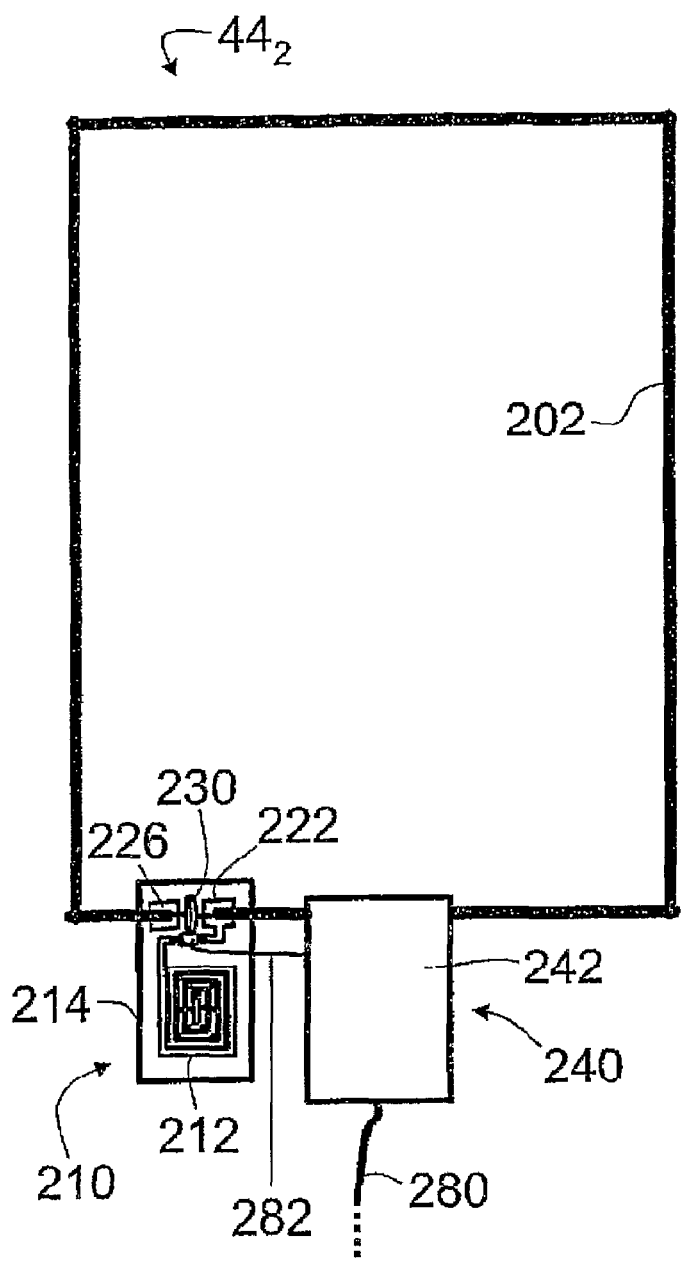
FIGS. 3A and 3B show diagrammatic top and side views, respectively, of a radio frequency coil incorporating the detuning decoupler of FIGS. 4, 4A, and 4B, and the electronics and balun of FIGS. 5A and 5B.
Figure 3B:
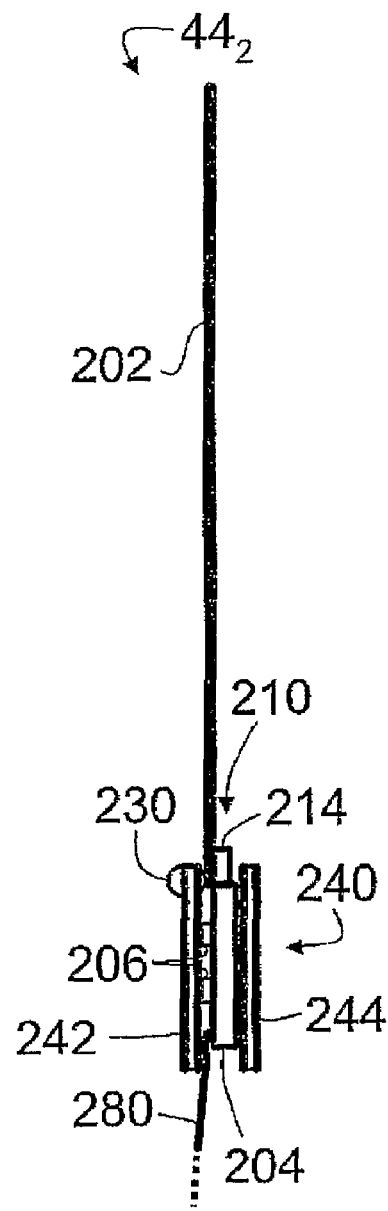

With reference to FIGS. 3A and 3B, a generally planar radio frequency coil 44₂ suitable for use as one of the coils 44 includes a generally planar radio frequency antenna 202, which in the embodiment of FIGS. 3A and 3B is a planar conductor loop. The antenna 202 is connected with a generally planar electronics board 204 supporting coil electronics 206 including receive electronics that receive a magnetic resonance signal from the antenna 202. For a transmit coil, or a transmit/receive coil, the coil electronics include transmit electronics that transmit a radio frequency excitation signal via the antenna.

Figure 4:
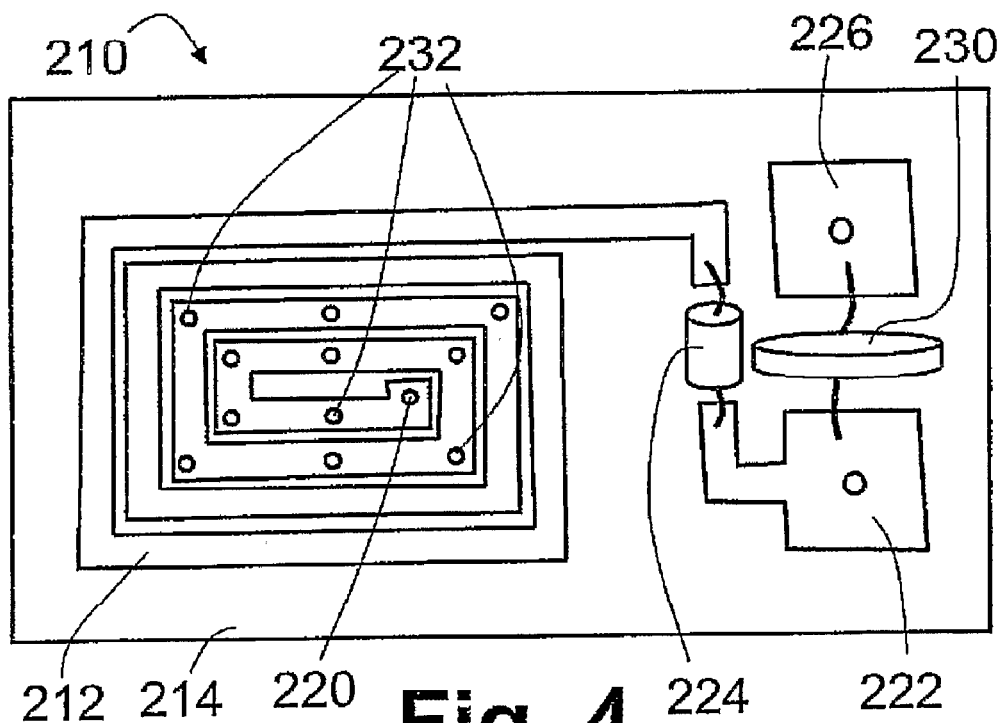
FIG. 4 shows a diagrammatic top view of the generally planar detuning decoupler of the generally planar radio frequency coil of FIGS. 3A and 3B.
Figure 4A:
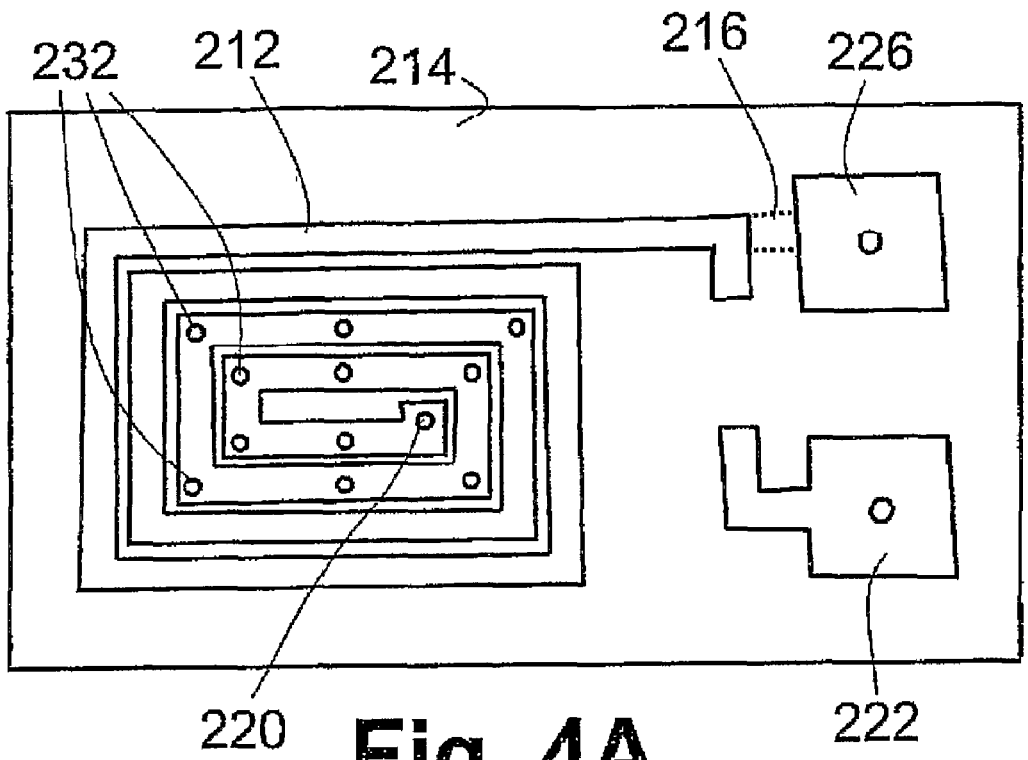
FIGS. 4A and 4B show top and bottom views, respectively, of the printed circuitry of the detuning decoupler of FIG. 4. In each view, hidden printed conductive traces from the other side which do not align with traces of the viewed side are indicated by dotted lines.
Figure 4B:
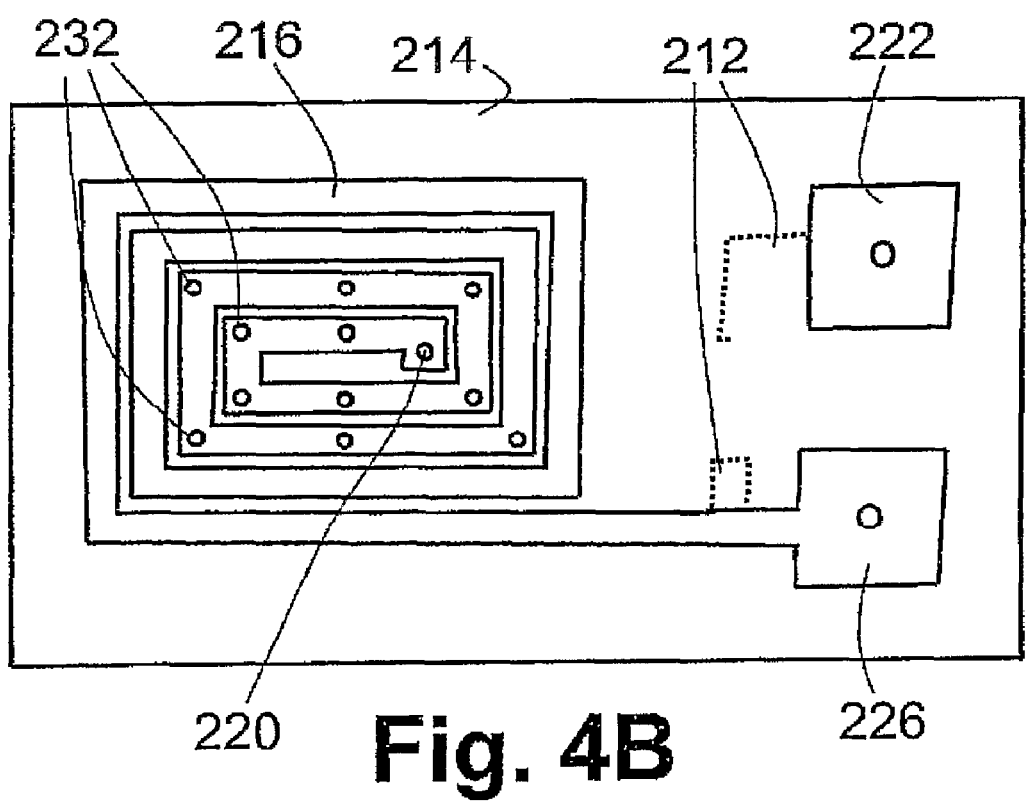

With continuing reference to FIGS. 3A and 3B and with further reference to FIGS. 4, 4A, and 4B, the radio frequency coil 44₂ further includes an inductor 210 used as a detuning decoupler, for example to detune a receive coil during the transmit phase of the magnetic resonance imaging sequence. The inductor 210 is formed by first spiraled printed circuitry 212 disposed on a first principal side of a decoupler substrate 214, and second spiraled printed circuitry 216 disposed on a second principal side of the decoupler substrate 214 opposite the first principal side. The second printed circuitry 216 parallels the first printed circuitry 212 to define a spiraled radio frequency transmission line having a short-circuit termination provided by a through-via 220 at the spiral center end of the transmission line. The decoupler substrate 214 should be made of a dielectric material within which electromagnetic fields of the transmission line can propagate. At the short-circuit termination 220, the first and second spiraled printed circuitry are conductively connected. At the opposite end of the spiraled transmission line, the first printed circuitry 212 terminates in a terminal 222 via a switching diode 224, and the second printed circuitry 216 terminates in a terminal 226.

The decoupler is inserted into the loop of the antenna 202 via the terminals 222, 226. A tuning capacitor 230 disposed across the terminals 222, 226 is selected to tune the decoupler to about the magnetic resonance frequency when the switching diode 224 is open or non-conducting. In this detuned mode, the decoupler represents a high impedance that detunes the antenna 202 during the radio frequency excitation phase of the magnetic resonance imaging sequence. During the receive phase, the switching diode 224 is open or non-conductive to enable reception of the magnetic resonance signal. Optionally, tuning vias 232 are provided at selected points along the transmission line. By connecting the first and second spiraled printed circuitry 212, 216 at one or more selected tuning vias 232, tuning of the decoupler is achieved. Thus, the decoupler can be tuned by selection of the capacitance of the tuning capacitor 230, by selective coupling of the tuning vias 232, or by a combination of these methods. Typically, the transmission line is tuned to be a quarter-wavelength transmission line respective to the magnetic resonance frequency to provide a high impedance. The switching diode 224 can be replaced by another switchable coupling element, such as a transistor or an optically switched photodiode.

An electrical current directed from the first terminal 222 to the second terminal 226 (with the switching diode 224 open) flows in a counterclockwise spiral through the first printed circuitry 212 as viewed from the first principal side (i.e., as viewed in FIGS. 4 and 4A), then crosses to the second printed circuitry 226 through the short-circuit termination 220, and then flows in a matching clockwise spiral through the second printed circuitry 216 again as viewed from the first principal side. The current flowing through the first spiraled printed circuitry 212 produces a first magnetic field, while the second spiraled printed circuitry 216 produces a second magnetic field. The first and second spiraled printed circuitry 212, 216 are connected to define the generally planar inductor 210 as a field-canceling inductance in which the first and second magnetic fields substantially cancel outside of the substrate 214.

In some contemplated embodiments, the first and second spiraled printed circuitry do not align to define a transmission line. In such embodiments, the inductance is due primarily to the spiral layout of the printed circuitry. In other contemplated embodiments, the printed circuitry on the two opposite sides is aligned to produce a transmission line, but the layout of the printed circuitry follows a tortuous path other than a spiral, such as a back-and-forth serpentine path. In these embodiments, the inductance is due to the parallel transmission line aspect. Generally, non-spiraled layouts occupy more substrate real estate as compared with spiraled layouts. In the embodiment illustrated in FIGS. 4, 4A, and 4B, the first and second printed circuitry 212, 216 both spiral and are aligned with one another. Hence, the inductor 210 advantageously has inductive contributions from both the parallel transmission line aspect and the spiral layout aspect.

Figure 5A:
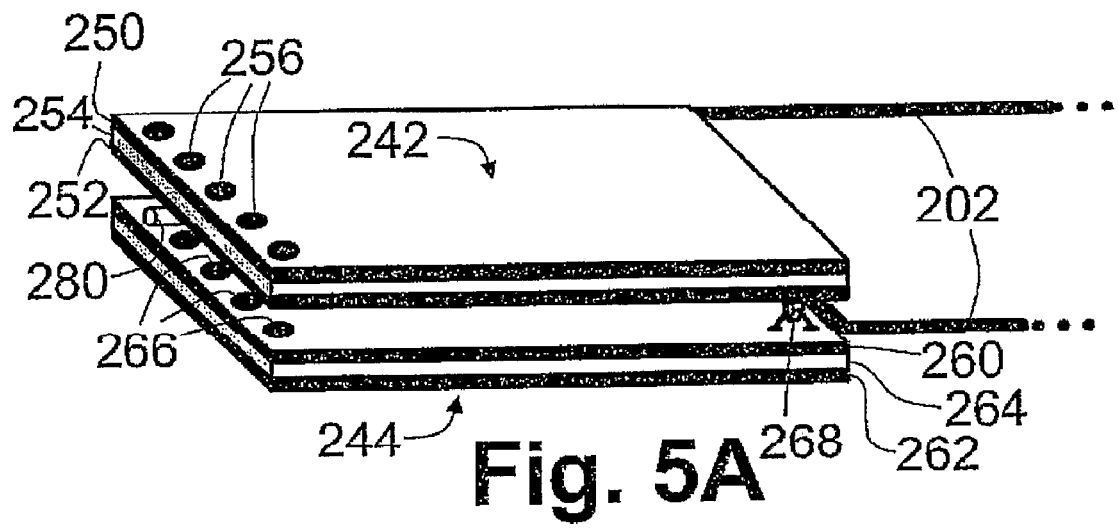
FIGS. 5A and 5B show a diagrammatic perspective view and a diagrammatic exploded perspective view, respectively, of the electronics board and balun of the generally planar radio frequency coil of FIGS. 3A and 3B.
Figure 5B:
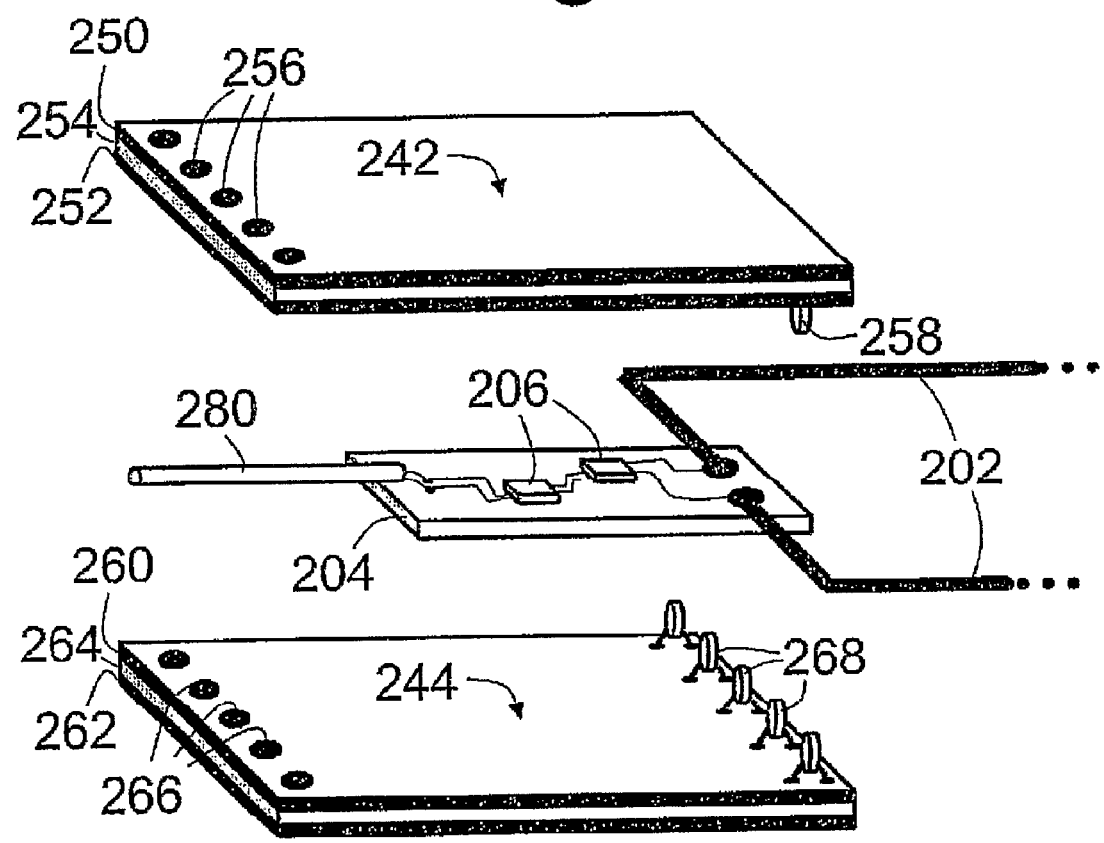

With continuing reference to FIGS. 3A and 3B and with further reference to FIGS. 5A and 5B, the radio frequency coil 44₂ further includes an inductor 240 used as a common mode rejection trap or balun. The inductance 240 is formed by first and second generally planar dual layer printed circuit boards 242, 244. The dual layer printed circuit board 242 includes first and second conductive layers 250, 252 defining parallel generally planar conductors separated by an insulating layer 254. The conductive layers 250, 252 and the insulating layer 254 define a planar transmission line that is short-circuited at one end by shorting vias 256 and is capacitively coupled at a second end generally opposite the first end by capacitances 258. The dual layer printed circuit board 244 similarly includes first and second conductive layers 260, 262 defining parallel generally planar conductors separated by an insulating layer 264. The conductive layers 260, 262 and the insulating layer 264 define a planar transmission line that is short-circuited at one end by shorting vias 266 and is capacitively coupled at a second end generally opposite the first end by capacitances 268.

The length of the conductive layers 250, 252, 260, 262 between the first and second ends, along with the capacitance values of the capacitances 258, 268, are selected to produce a resonant transmission line, with high impedance, respective to the magnetic resonance frequency, or to produce another selected radio frequency trapping characteristic. The first and second generally planar dual layer printed circuit boards 242, 244 sandwich the generally planar electronics board 204 supporting the coil electronics 206 to define a bazooka trap or balun that rejects common mode signals at the magnetic resonance frequency from coupling to or from a radio frequency cable 280 connected with the coil electronics 206. The electronics 206 also communicate with the switching diode 224 of the detuning decoupler 210 via a control line 282 (shown in FIG. 3A) to selectively detune the antenna 202 during the transmit phase of the imaging sequence.

While the conductive layers 250, 252, 260, 262 are capacitively terminated by the capacitances 258, 268, in some other embodiments the second end is open-circuited, and the resonance frequency of the balun is tuned to about the magnetic resonance frequency using the length of the conductive layers 250, 252, 260, 262. Rather than using dual layer printed circuit boards, air-spaced or otherwise insulated parallel generally planar conductors can be employed. In some contemplated embodiments, one of the two dual layer printed circuit boards 242, 244 is omitted. If both printed circuit boards 242, 244 are included as illustrated in FIGS. 5A and 5B, then in addition to providing common mode rejection, the conductive layers 250, 252, 260, 262 also suitably provide electromagnetic shielding for the electronics 206 if the width of the conductive layers 250, 252, 260, 262 is sufficient to span the electronics 206. Still further, while continuous unpatterned conductive layers 250, 252, 260, 262 are illustrated, in some contemplated embodiments the conductive layers are patterned to reduce distortion of magnetic field gradient fields by the conductive layers.

When the radio frequency coil $44_2$ is used as one of the coils 44 of the coils apparel 40, the inductances 210, 240, are optionally flexible. For example, the generally planar decoupler substrate 214 can be a flexible substrate, and the generally planar dual layer printed circuit boards 242, 244 can be flexible.

Figure 6A:
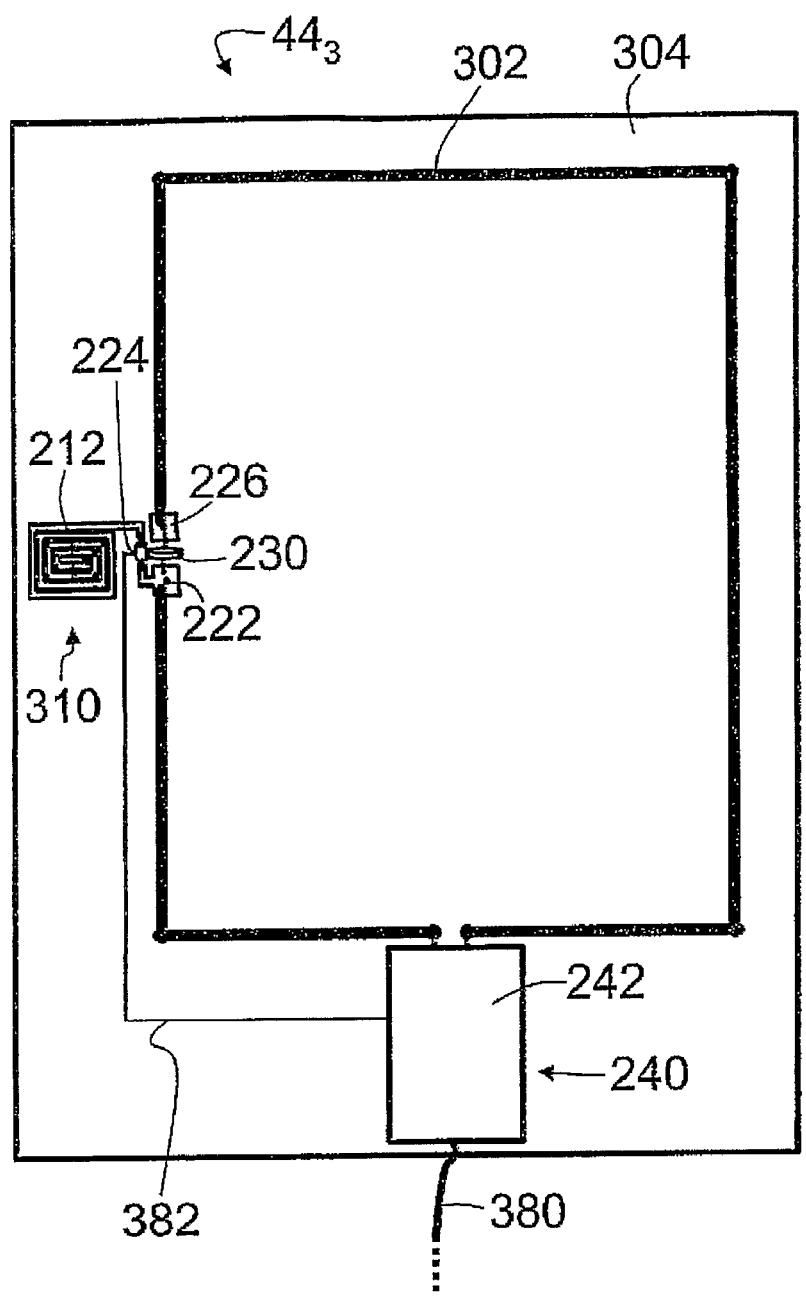
FIGS. 6A and 6B show diagrammatic top and side views, respectively, of a radio frequency coil incorporating the decoupler circuitry of FIGS. 4, 4A, and 4B and the electronics and balun of FIGS. 5A and 5B on a common substrate that also supports a printed circuit antenna.
Figure 6B:
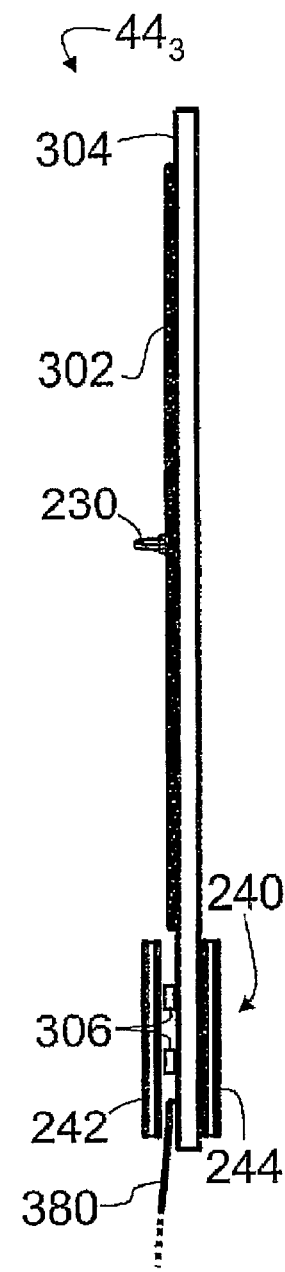

With reference to FIGS. 6A and 6B, a generally planar radio frequency coil $44_3$ suitable for use as one of the coils 44 includes a generally planar radio frequency antenna 302, which in the embodiment of FIGS. 3A and 3B is a copper trace loop disposed on an electrically insulating generally planar coil substrate 304, which further supports coil electronics 306 including receive electronics that receive a magnetic resonance signal from the antenna 302. For a transmit coil, or a transmit/receive coil, the coil electronics also include transmit electronics that transmit a radio frequency excitation signal via the antenna. The radio frequency coil $44_3$ further includes an inductor 310 used as a detuning decoupler. The inductance 310 is formed by first and second spiraled printed circuitry 212, 216 of FIGS. 4, 4A, and 4B (only first printed circuitry 212 being visible in FIG. 6A) disposed on the common substrate 304 (rather than on a separate decoupler substrate) and connected with the switching diode 224 and the tuning capacitor 230 disposed across the terminals 222, 226. The radio frequency coil $44_3$ further includes the inductor 240 including the generally planar dual layer printed circuit boards 242, 244 sandwiching the electronics 306 as a common mode rejection trap or balun blocking common mode signals at about the magnetic resonance frequency from coupling to or from a radio frequency cable 380 connected with the electronics 306. A control line 382 connects the switching diode 224 of the decoupler with the electronics 306.

As best seen in FIGS. 3A and 6A, the disclosed generally planar radio frequency coils are thin or low profile. Indeed, the coils $44_2$, $44_3$ have thicknesses limited by the thicknesses and separation of the generally planar dual layer printed circuit boards 242, 244, and by the height of the capacitor 230. The coil electronics 106, 206, 306 are preferably surface mount components having low profiles. In such arrangements, the substantially planar coil thickness can be less than five millimeters.

With returning reference to FIG. 1 and with further reference to FIGS. 7A, 7B, and 7C, the disclosed generally planar inductors are not limited to use with substantially planar coil antennas, but rather also find advantageous use in other low profile antennas. FIGS. 7A, 7B, and 7C illustrate the coil 32 which is a low profile birdcage coil formed of conductive traces 34 disposed on substrate 36, such as a generally planar printed circuit board that has been curved around into the form of a cylinder. As best seen in the cutaway view of FIG. 7A, the printed conductive traces 34 are disposed on the inside surface of the cylindrical substrate 36 and define the rings and rungs of the birdcage coil. Additionally, the printed circuitry defines an inductor 410 used as a detuning decoupler. The inductor 410 is formed by first and second spiraled printed circuitry 212, 216 of FIGS. 4, 4A, and 4B disposed on the cylindrical substrate 36 (rather than on a separate decoupler substrate) and connected with the birdcage coil defined by conductive traces 34 to selectively detune the birdcage coil. Specifically, the printed circuitry 212 is disposed on the inside surface of the cylindrical substrate 36, while the printed circuitry 216 is disposed on the outside surface of the cylindrical substrate 36. (Note, the vantage point of the perspective view of FIG. 7C is rotated 180° away from the vantage point of the perspective view of FIGS. 7A and 7B, thus viewing the printed circuitry 216 on the outside of the cylindrical substrate 36).

Because the coil 32 including the inductance 410 employs printed circuitry, the birdcage coil 32 has a low profile that occupies limited space within the scanner housing 12. Alternatively, the low profile birdcage coil 32 can be disposed inside the bore 14 as a bore liner that also serves as a transmit/receive coil. Although not illustrated, it will be appreciated that the balun inductor 240 is also optionally readily incorporated into the low profile birdcage coil 32, so as to provide common mode rejection for coil electronics. The illustrated low profile whole-body birdcage coil 32 is an example; the disclosed generally planar inductors can similarly be incorporated into other low profile non-planar coils, such as low profile head coils.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A low profile radio frequency coil for use in a magnetic resonance imaging system, the radio frequency coil comprising:
    a low profile antenna configured to resonate at about a magnetic resonance frequency of the magnetic resonance imaging system; and
    a generally planar inductor electrically connected or coupled with the low profile antenna to provide selected frequency filtering of a radio frequency signal received or transmitted by the low profile antenna.

2. The radio frequency coil as set forth in claim 1, wherein the generally planar inductor includes:
    printed circuitry disposed on a first principal side of a substrate.

3. The radio frequency coil as set forth in claim 2, wherein the generally planar inductor further includes:
    printed circuitry disposed on a second principal side of the substrate opposite the first principal side, the printed circuitry on the second principal side paralleling the printed circuitry on the first principal side to define a radio frequency transmission line.

4. The radio frequency coil as set forth in claim 3, wherein the printed circuitry disposed on each of the first principal side and second principal side have matching tortuous layouts.

5. The radio frequency coil as set forth in claim 4, wherein the tortuous layout is a spiraled layout.

6. The radio frequency coil as set forth in claim 3, wherein the coil is a magnetic resonance receive coil, the coil further including:
    a capacitance electrically connected with the transmission line defined by the printed circuitry to define a decoupler resonant circuit tuned to about the magnetic resonance frequency; and a coupling element (i) selectively coupling the decoupler resonant circuit and the low profile antenna during a transmit phase of magnetic resonance imaging and (ii) selectively decoupling the decoupler resonant circuit and the low profile antenna during a receive phase of magnetic resonance imaging.

7. The radio frequency coil as set forth in claim 3, wherein the printed circuitry on the first principal side and the printed circuitry on the second principal side are short circuited together at one end of the radio frequency transmission line, and the transmission line is coupled with electronics to trap a common mode at the magnetic resonance frequency.

8. The radio frequency coil as set forth in claim 2, wherein the printed circuitry has a generally spiral layout defining a first inductive spiral with a first magnetic field.

9. The radio frequency coil as set forth in claim 8, wherein the generally planar inductor further includes:
   printed circuitry disposed on a second principal side of the substrate opposite the first side, the printed circuitry on the second principal side having a generally spiral layout defining a second inductive spiral with a second magnetic field, the first and second inductive spirals being connected to define the generally planar inductor as a field canceling inductance in which the first and second magnetic fields substantially cancel outside of the substrate.

10. The radio frequency coil as set forth in claim 2, wherein the low profile coil is generally planar and has a thickness less than five millimeters.

11. The radio frequency coil as set forth in claim 2, wherein the substrate is a cylindrical substrate of low annular thickness, and the low profile antenna includes conductive traces disposed on the cylindrical substrate.

12. The radio frequency coil as set forth in claim 2, wherein the generally planar inductor is incorporated into electronics of the radio frequency coil to provide one of (i) rejection of a common mode of the radio frequency signal received by or transmitted by the low profile antenna, (ii) selective decoupling of the low profile antenna, and (iii) impedance matching for communication of the radio frequency signal received by or transmitted by the low profile antenna.

13. The radio frequency coil as set forth in claim 1, wherein at least one of the low profile antenna and the generally planar inductor is mounted on a flexible substrate.

14. The radio frequency coil as set forth in claim 1, wherein the radio frequency coil is incorporated in an item of clothing worn by a human imaging subject imaged by the magnetic resonance imaging system.

15. The radio frequency coil as set forth in claim 1, further including:
   a generally planar electronics board including coil electronics coupled with the low profile antenna, the coil electronics including at least one of: (i) transmit electronics that transmit the radio frequency signal via the antenna, and (ii) receive electronics that receive the radio frequency signal from the antenna.

16. A low profile radio frequency coil for use in a magnetic resonance imaging system, the radio frequency coil comprising:
   a low profile antenna configured to resonate at about a magnetic resonance frequency of the magnetic resonance imaging system;
   a generally planar electronics board including coil electronics coupled with the low profile antenna, the coil electronics including at least one of: (i) transmit electronics that transmit the radio frequency signal via the antenna, and (ii) receive electronics that receive the radio frequency signal from the antenna; and
   a generally planar inductor electrically connected or coupled with the low profile antenna to provide selected frequency filtering of a radio frequency signal received or transmitted by the low profile antenna, the generally planar inductor including first and second parallel generally planar conductors arranged substantially parallel with the generally planar electronics board, the first and second parallel generally planar conductors electrically connected together to define a radio frequency trap tuned to about the magnetic resonance frequency and coupled with the coil electronics.

17. The radio frequency coil as set forth in claim 16, wherein the inductor includes:
   a first dual layer printed circuit board having first and second conductive layers.

18. The radio frequency coil as set forth in claim 17, wherein the inductor further includes:
   a second dual layer printed circuit board having first and second conductive layers, the generally planar electronics board being sandwiched between the first and second dual layer printed circuit boards.

19. The radio frequency coil as set forth in claim 16, wherein the inductor further includes:
   printed circuitry disposed on a substrate and switchably electrically connected with the low profile antenna to define a decoupler.

20. The radio frequency coil as set forth in claim 16, wherein the first and second parallel generally planar conductors are conductively connected at a first end, and have a second end generally opposite the first end that is one of (i) electrically unconnected and (ii) capacitively connected to define the radio frequency trap as a transmission line tuned to about the magnetic resonance frequency.

21. A low profile radio frequency coil for use in a magnetic resonance imaging system, the radio frequency coil comprising:
   a low profile antenna configured to resonate at about a magnetic resonance frequency of the magnetic resonance imaging system; and
   a generally planar inductor electrically connected or coupled with the low profile antenna to provide selected frequency filtering of a radio frequency signal received or transmitted b the low profile antenna the generally planar inductor including a transmission line defined by two generally planar conductors arranged parallel with one another.

22. The radio frequency coil as set forth in claim 21, wherein the two generally planar conductors of the generally planar inductor include two substantially identical conductive traces disposed on opposite sides of a printed circuit board.

23. The radio frequency coil as set forth in claim 21, wherein the transmission line is a quarter wavelength transmission line respective to the magnetic resonance frequency.

24. The radio frequency coil as set forth in claim 21, wherein the transmission line is switchably electrically connected with the low profile antenna to define a decoupler.

25. The radio frequency coil as set forth in claim 21, further including:
   coil electronics connected with the low profile antenna, the transmission line defining a radio frequency trap tuned to about the magnetic resonance frequency and coupled with the coil electronics to provide common mode rejection.

26. The radio frequency coil as set forth in claim 25, wherein the two generally planar conductors include:

first and second parallel generally planar conductors defining the transmission line as a generally planar transmission line arranged parallel with the generally planar electronics board.

27. A magnetic resonance imaging system comprising:

a main magnet generating a main magnetic field in an imaging region;

magnetic field gradient coils superimposing selected magnetic field gradients on the main magnetic field in the imaging region; and a low profile radio frequency coil as set forth in claim 1 for performing at least one of (i) exciting magnetic resonance in an imaging subject disposed in the imaging region, and (ii) receiving magnetic resonance excited in the imaging subject disposed in the imaging region.

* * * * *